United States Patent
Joe et al.

(10) Patent No.: US 9,389,278 B2
(45) Date of Patent: Jul. 12, 2016

(54) APPARATUS AND METHOD FOR ESTIMATING POWER OF SECONDARY BLENDED COMPRISING BLENDED CATHODE MATERIAL

(71) Applicant: LG CHEM, LTD., Seoul (KR)

(72) Inventors: Won-Tae Joe, Daejeon (KR); Sun-Young Cha, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/531,365

(22) Filed: Nov. 3, 2014

(65) Prior Publication Data

US 2015/0051855 A1 Feb. 19, 2015

Related U.S. Application Data

(63) Continuation of application No. PCT/KR2013/011034, filed on Nov. 29, 2013.

(30) Foreign Application Priority Data

Nov. 29, 2012 (KR) .................. 10-2012-0137320
Nov. 29, 2013 (KR) .................. 10-2013-0147620

(51) Int. Cl.
*G01R 31/36* (2006.01)
*H01M 10/42* (2006.01)

(52) U.S. Cl.
CPC .......... *G01R 31/362* (2013.01); *G01R 31/3606* (2013.01); *G01R 31/3624* (2013.01); *G01R 31/3648* (2013.01); *G01R 31/3651* (2013.01); *H01M 10/4285* (2013.01)

(58) Field of Classification Search
USPC ..................... 702/60, 63, 64, 65; 320/160
See application file for complete search history.

(56) References Cited

U.S. PATENT DOCUMENTS 4,343,871 A * 8/1982 Tobishima et al. ........... 429/333
5,658,682 A 8/1997 Usuda et al.
(Continued)

FOREIGN PATENT DOCUMENTS

JP 6-174808 A 6/1994
JP 2000-90982 A 3/2000
(Continued)

OTHER PUBLICATIONS

International Search Report issued in PCT/JP2013/011034, dated Mar. 14, 2014.
(Continued)

*Primary Examiner* — Mohamed Charioui
(74) *Attorney, Agent, or Firm* — Birch, Stewart, Kolasch & Birch, LLP

(57) ABSTRACT

Disclosed is an apparatus and method for estimating a power of a secondary battery comprising a blended cathode material. The apparatus according to the present invention estimates a power of a secondary battery comprising a blended cathode material in which at least a first cathode material and a second cathode material are blended, the apparatus comprising a discharging means for discharging the secondary battery under conditions of a plurality of discharge rates (c-rate) different from each other, a sensor means for measuring a plurality of discharge termination voltages ($V_f$) corresponding to the conditions of the plurality of discharge rates, and a control means for approximating a correlation between the plurality of discharge rates and the plurality of discharge termination voltages by a two-dimensional linear equation, calculating a maximum discharge rate ($C_{max}$) of the secondary battery corresponding to a minimum discharge voltage ($V_{min}$) using the linear equation, and estimating a maximum power ($P_{max}$) of the secondary battery from the calculated maximum discharge rate.

22 Claims, 6 Drawing Sheets

(56) References Cited

U.S. PATENT DOCUMENTS

| | | | |
|---|---|---|---|
| 6,677,082 B2 | 1/2004 | Thackeray et al. | |
| 6,680,143 B2 | 1/2004 | Thackeray et al. | |
| 2004/0234865 A1* | 11/2004 | Sato et al. | 429/322 |
| 2006/0087291 A1* | 4/2006 | Yamauchi | 320/137 |
| 2006/0206276 A1 | 9/2006 | Kim et al. | |
| 2008/0007221 A1 | 1/2008 | Lee | |
| 2008/0254366 A1* | 10/2008 | Kobayashi | H01M 4/32 429/223 |
| 2009/0037124 A1* | 2/2009 | Majima | G01R 31/3675 702/63 |
| 2009/0123813 A1 | 5/2009 | Chang et al. | |
| 2010/0079111 A1 | 4/2010 | Masuda | |
| 2011/0254559 A1 | 10/2011 | Nakashima et al. | |
| 2011/0311872 A1 | 12/2011 | Oh et al. | |
| 2013/0065118 A1* | 3/2013 | Chang | H01M 4/364 429/211 |
| 2013/0257381 A1* | 10/2013 | Diamond | B60L 11/1861 320/134 |

FOREIGN PATENT DOCUMENTS

| | | | |
|---|---|---|---|
| JP | 2004-340587 | A | 12/2004 |
| JP | 2005-155631 | A | 6/2005 |
| JP | 2007-103187 | A | 4/2007 |
| JP | 2010-169609 | A | 8/2010 |
| JP | 2010-223768 | A | 10/2010 |
| JP | 2323238 | A2 | 5/2011 |
| JP | 2011-517361 | A | 6/2011 |
| JP | 2012-212513 | A | 11/2012 |
| KR | 10-2006-0052273 | A | 5/2006 |
| KR | 10-2006-0096820 | A | 9/2006 |
| KR | 10-1134894 | B1 | 4/2012 |

OTHER PUBLICATIONS

Written Opinion of the International Searching Authority issued in PCT/JP2013/011034, dated Mar. 14, 2014.

* cited by examiner

APPARATUS AND METHOD FOR ESTIMATING POWER OF SECONDARY BLENDED COMPRISING BLENDED CATHODE MATERIAL

CROSS-REFERENCE TO RELATED APPLICATION

The present application is a continuation of International Application No. PCT/KR2013/011034 filed on Nov. 29, 2013, which claims priority to Korean Patent Application No. 10-2012-0137320 filed in the Republic of Korea on Nov. 29, 2012 and Korean Patent Application No. 10-2013-0147620 filed in the Republic of Korea on Nov. 29, 2013, the disclosures of which are incorporated herein by reference.

TECHNICAL FIELD

The present disclosure relates to an apparatus and method for estimating a power of a secondary battery including a blended cathode material.

BACKGROUND ART

A battery is a device that produces electrical energy through electrochemical oxidation and reduction reactions, and has a wide range of various applications. For example, an application field of a battery is gradually expanding to a power source of handheld portable devices such as a mobile phone, a laptop computer, a digital camera, a video camera, a tablet computer, and an electric tool; various types of electric drive devices such as an electric bike, an electric motorcycle, an electric vehicle, a hybrid vehicle, an electric boat, and an electric aircraft; an energy storage system used to store electricity generated through new renewable energy or excess electricity of a power plant; and an uninterruptible power supplier for stable power supply to various types of information and communication devices including a server computer and a base station for communication.

A battery includes three basic elements; one is an anode including a material which oxides while emitting electrons during discharge, another is a cathode including a material which reduces while accepting electrons during discharge, and the other is an electrolyte which allows ions to move between the anode and the cathode.

A battery may be classified into a primary battery that cannot be reused after discharged, and a secondary battery that can be charged and discharged repeatedly due to at least partially reversible electrochemical reactions.

As a secondary battery, a lead-acid battery, a nickel-cadmium battery, a nickel-zinc battery, a nickel-iron battery, a silver-oxide battery, a nickel metal hydride battery, a zinc-manganese dioxide battery, a zinc-bromine battery, a metal-air battery, and a lithium secondary battery are known. Among them, a lithium secondary battery has a higher energy density, a higher battery voltage, and a longer lifespan than the other secondary batteries, and for these reasons, is attracting the greatest attention in commercial aspects.

A lithium secondary battery is characterized by intercalation and de-intercalation reactions of a lithium ion occurring at a cathode and an anode. That is, during discharge, a lithium ion de-intercalated from an anode material included in an anode moves to a cathode through an electrolyte and are intercalated into a cathode material included in the cathode, and vice versa when charging.

In the lithium secondary battery, because a material used as a cathode material significantly affects performance of the secondary battery, various attempts have been made to provide a cathode material having a high energy capacity while maintaining stability at high temperature as well as having low manufacturing costs. However, there is still a limitation in satisfying all the industrial performance standards with only one cathode material.

Recently, with the growing concerns on exhaustion of fossil fuels and air pollution, there is a drastic increase in demand for eco-friendly energy. In this context, commercialization of an electric drive vehicle such as an electric vehicle or a hybrid vehicle that is powered and runs by electrical energy supplied from a secondary battery is being accelerated by developed countries.

A speed of an electric drive vehicle is proportional to a power of a secondary battery. Accordingly, a control unit of the electric drive vehicle has a function of monitoring how much power the secondary battery can provide. Also, the control unit controls various types of driving devices including a motor to safely drive the electric drive vehicle within a range of maximum power the secondary battery can provide. Therefore, to optimize the travel performance of the electric drive vehicle, there is a need for a method for accurately calculating a power of the secondary battery.

DISCLOSURE

Technical Problem

A power of a secondary battery is influenced by electrochemical properties of a cathode material. Thus, the secondary battery may exhibit a unique electrochemical behavior based on a type of the cathode material included in the secondary battery. In this case, accurately estimating the power of the secondary battery is more difficult.

The present disclosure is directed to providing an apparatus and method for accurately estimating a power of a secondary battery including a blended cathode material composed of at least two cathode materials in consideration of performance required for the secondary battery in the market and exhibiting a unique electrochemical behavior due to the blended cathode material.

Technical Solution

To achieve the above object, an apparatus for estimating a power of a secondary battery including a blended cathode material composed of at least a first cathode material and a second cathode material according to the present disclosure comprises a discharging means configured to discharge a secondary battery under conditions of a plurality of discharge rates (c-rate) different from each other, a sensor means configured to measure a plurality of discharge termination voltages ($V_f$) corresponding to the conditions of the plurality of discharge rates, and a control means configured to approximate a correlation between the plurality of discharge rates and the plurality of discharge termination voltages by a two-dimensional linear equation, calculate a maximum discharge rate ($C_{max}$) of the secondary battery corresponding to a minimum discharge voltage ($V_{min}$) using the linear equation, and estimate a maximum power ($P_{max}$) of the secondary battery from the calculated maximum discharge rate.

To achieve the above object, a method for estimating a power of a secondary battery according to the present disclosure comprises (a) discharging a secondary battery under conditions of a plurality of discharge rates (c-rate) different from each other, the secondary battery including a blended cathode material composed of at least a first cathode material and a second cathode material, (b) measuring a plurality of discharge termination voltages ($V_f$) corresponding to the conditions of the plurality of discharge rates, (c) approximating a correlation between the plurality of discharge rates and the plurality of discharge termination voltages by a two-dimensional linear equation, and calculating a maximum discharge rate ($C_{max}$) of the secondary battery corresponding to a minimum discharge voltage ($V_{min}$) using the linear equation, and (d) estimating a maximum power ($P_{max}$) of the secondary battery from the calculated maximum discharge rate.

According to one aspect, the discharging means may pulse discharge the secondary battery at a time interval under the conditions of the plurality of discharge rates different from each other.

According to another aspect, the conditions of the plurality of discharge rates may be larger than a maximum value of a transition discharge rate observed on an I-V profile measured for each state of charge (SOC) of the secondary battery.

Here, the I-V profile is a graph obtained by plotting discharge termination voltages ($V_f$) of the secondary battery in accordance with varying discharge rate, wherein the discharge termination voltages are measured immediately after discharging the secondary battery having the same SOC for a predetermined time at different discharge rates.

The I-V profile shows how much a dynamic voltage of the secondary battery drops when the discharge rate changes under the same SOC condition. The I-V measurement profile generally has a form of a linear function with a negative slope.

However, when the SOC (or open-circuit voltage) of the secondary battery including the blended cathode material belongs to a specific range, the slope of the I-V measurement profile changes based on a specific discharge rate.

As described above, the discharge rate near which the slope of the I-V profile changes may be defined as a transition discharge rate, and the transition discharge rate changes depending on SOCs (or open-circuit voltages) of the secondary battery. The I-V measurement profile may be plotted for each SOC of the secondary battery.

According to still another aspect, the control means may approximate the linear equation using at least two pairs of discharge rates and discharge termination voltages According to yet another aspect, the control means may calculate the maximum discharge rate ($C_{max}$) and the maximum power ($P_{max}$) of the secondary battery using Equations 1 and 2 below.

Here, the maximum discharge rate is indicated in units of C-rate, but it is obvious that the maximum discharge rate may be given in Ampere by units conversion.

Maximum discharge rate ($C_{max}$)=(Y intercept of linear equation−minimum discharge voltage)/absolute value of linear equation slope   <Equation 1>

$P_{max}$=maximum discharge rate ($C_{max}$)*minimum discharge voltage ($V_{min}$)   <Equation 2>

In the present disclosure, as the voltage changes, reaction concentrations of working ions reacting with the first cathode material and the second cathode material differ.

In this case, when measuring a resistance profile as a function of SOC, the secondary battery including the first cathode material and the second cathode material has a convex pattern on the resistance profile, and two inflection points occur before and after an apex of the convex pattern.

Also, when measuring an open-circuit voltage profile as a function of SOC, the secondary battery including the first cathode material and the second cathode material has at least one voltage plateau on the open-circuit voltage profile.

Here, the working ion represents an ion which causes an electrochemical reaction with the first cathode material and the second cathode material during charge or discharge of the secondary battery including the blended cathode material.

The working ion may change based on a type of the secondary battery. For example, in the case of a lithium secondary battery, a lithium ion may be the working ion.

The electrochemical reaction includes oxidation and reduction reactions of the first cathode material and the second cathode material occurred when charging or discharging the secondary battery, and may change based on a working mechanism of the secondary battery.

For example, the electrochemical reaction may represent intercalation of the working ion into the first cathode material and/or the second cathode material, or deintercalation of the working ion from the first cathode material and/or the second cathode material.

In this case, a concentration of the working ion intercalated into the first cathode material and the second cathode material or a concentration of the working ion deintercalated from the first cathode material and the second cathode material may change depending on voltage of the secondary battery.

For example, under a discharge condition of the secondary battery, the working ion may be preferentially intercalated into the first cathode material than the second cathode material in a certain voltage range, and vice versa in the other voltage range.

As another example, under a charge condition of the secondary battery, the working ion may be preferentially deintercalated from the second cathode material than the first cathode material in a certain voltage range, and vice versa in the other voltage range.

Hereinafter, the following description is provided based on a premise that the working ion is preferentially intercalated into the first cathode material than the second cathode material in a high voltage range and vice versa in a low voltage range, when the secondary battery is discharged.

The open-circuit voltage of the secondary battery represents a voltage measured when charging or discharging of the secondary battery stops and the secondary battery is in an electrochemically stable state. The open-circuit voltage may be considered as a parameter equivalent to an SOC because the open-circuit voltage has a one-to-one relationship with the SOC of the secondary battery.

In the present disclosure, the first cathode material and the second cathode material are not limited to a specific kind of a material if the reaction concentrations thereof with the working ion are different from each other depending on voltage of the secondary battery.

According to one aspect, the first cathode material may be an alkali metal compound represented by a general chemical formula $A[A_xM_y]O_{2+z}$ (A includes at least one element of Li, Na and K; M includes at least one element selected from Ni, Co, Mn, Ca, Mg, Al, Ti, Si, Fe, Mo, V, Zr, Zn, Cu, Al, Mo, Sc, Zr, Ru, and Cr; $x \geq 0$, $1 \leq x+y \leq 2$, $-0.1 \leq z \leq 2$; x, y, z, and stoichiometric coefficients of components included in M are selected for the compound to maintain electrical neutrality).

Optionally, the first cathode material may be an alkali metal compound $xLiM^1O_2-(1-x)Li_2M^2O_3$ ($M^1$ includes at least one element having an average oxidation state of 3; $M^2$ includes at least one element having an average oxidation state of 4; $0 \leq x \leq 1$) disclosed in U.S. Pat. No. 6,677,082 and U.S. Pat. No. 6,680,143.

According to another aspect, the second cathode material may be lithium metal phosphate represented by a general chemical formula $Li_aM^1_xFe_{1-x}M^2_yP_{1-y}M^3_zO_{4-z}$ ($M^1$ includes at least one element selected from Ti, Si, Mn, Co, Fe, V, Cr, Mo, Ni, Nd, Al, Mg, and Al; $M^2$ includes at least one element selected from Ti, Si, Mn, Co, Fe, V, Cr, Mo, Ni, Nd, Al, Mg, Al, As, Sb, Si, Ge, V, and S; $M^3$ includes at least one element selected from halogen group elements including F; $0<a\leq2$, $0\leq x\leq1$, $0\leq y<1$, $0\leq z<1$; a, x, y, z, and stoichiometric coefficients of components included in $M^1$, $M^2$, and $M^3$ are selected for the compound to maintain electrical neutrality), or $Li_3M_2(PO_4)_3$ [M includes at least one element selected from Ti, Si, Mn, Fe, Co, V, Cr, Mo, Ni, Al, Mg, and Al].

According to still another aspect, the first cathode material may be $Li[Li_aNi_bCo_cMn_dO_{2+z}]$ ($a\geq0$; $a+b+c+d=1$; at least one of b, c, and d is not zero; $0.1\leq z\leq2$). Also, the second cathode material may be at least one selected from the group consisting of $LiFePO_4$, $LiMn_xFe_yPO_4(0<x+y\leq1)$ and $Li_3Fe_2(PO_4)_3$.

According to yet another aspect, the first cathode material and/or the second cathode material may include a coating layer. The coating layer may include a carbon layer, or an oxide layer or a fluoride layer including at least one element selected from the group consisting of Ti, Si, Mn, Co, Fe, V, Cr, Mo, Ni, Nd, Al, Mg, As, Sb, Si, Ge, V, and S.

In the present disclosure, types and a blend ratio of the first cathode material and the second cathode material is selected to generate a convex pattern on the discharge resistance profile or at least one voltage plateau on the open-circuit profile while considering the purpose of use and performance of the secondary battery to be manufactured.

In one embodiment, in the case where a secondary battery with high discharge power is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 5:5.

In another embodiment, in the case where a secondary battery with high-temperature stability is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 2:8.

In still another embodiment, in the case where a low cost secondary battery is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 1:9.

In yet another embodiment, in the case where a secondary battery with high discharge power and high-temperature stability is desired, $[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 4:6.

In further another embodiment, in the case where a secondary battery with high capacity per weight is desired, $Li[Ni_{0.5}Mn_{0.3}Co_{0.2}]O_2$ and $LiFePO_4$ may be selected as the first cathode material and the second cathode material, respectively, and a blend ratio of the first cathode material and the second cathode material may be set to 9:1.

A method of controlling the types and blend ratio of the first cathode material and the second cathode material as above is merely an example. It is obvious to those skilled in the art to properly select the first cathode material and the second cathode material and tune a blend ratio for each cathode material in consideration of relative importance and balance of electrochemical properties to be imparted on the blended cathode material.

In the present disclosure, a number of cathode materials that may be included in the blended cathode material are not limited to two. As an embodiment, the blended cathode material may include three different cathode materials. For example, a blended cathode material may include $LiMn_2O_4$, $Li[Li_aNi_xCo_yMn_zO_2$ [$a\geq0$; $x+y+z=1$; at least one of x, y, and z is not zero], and $LiFePO_4$. As another embodiment, the blended cathode material may include four different cathode materials. For example, a blended cathode material may include $LiNiO_2$, $LiMn_2O_4$, $Li[Li_aNi_xCo_yMn_zO_2$ [$a\geq0$; $x+y+z=1$; at least one of x, y, and z is not zero], and $LiFePO_4$.

Also, to enhance the properties of the blended cathode material, other additives, for example, a conductive material, a binder, and the like, may be added to the blended cathode material, and there is no particular limitation thereto. Accordingly, any blended cathode material including at least two cathode materials may be construed as being included in the scope of the present disclosure regardless of a number of cathode materials and the presence of other additives.

According to the present disclosure, the secondary battery is charged or discharged between a predefined minimum discharge voltage and a predefined maximum discharge voltage based on an open-circuit voltage. As an example, the minimum discharge voltage may be from 2.0 to 3.0V, and the maximum discharge voltage may be from 4.0 to 4.6V. Hereinafter, a voltage range between the minimum discharge voltage and the maximum discharge voltage is referred to as a usage voltage range of the secondary battery.

Here, the usage voltage range may change based on the types and blend ratio of the first cathode material and the second cathode material, and may be divided into three voltage ranges, i.e., a first cathode material voltage range ($\Delta V_1$), a transition voltage range ($\Delta V_t$), and a second cathode material voltage range ($\Delta V_2$).

Here, the first cathode material voltage range ($\Delta V_1$) represents a voltage range in which the working ion is mainly intercalated into the first cathode material when the secondary battery is discharged regardless of the magnitude of the discharge rate. Also, the transition voltage range ($\Delta V_t$) represents a voltage range in which a cathode material into which the working ion is mainly intercalated when the secondary battery is discharged changes from the first cathode material to the second cathode material based on a particular discharge rate (transition discharge rate). Also, the second cathode material voltage range ($\Delta V_2$) represents a voltage range in which the working ion is mainly intercalated into the second cathode material when the secondary battery is discharged regardless of the magnitude of the discharge rate.

When the discharge rate (C-rate) increases during pulse discharge of the secondary battery, the discharge termination voltage ($V_f$) reduces as the discharge rate increases. That is, even though an open-circuit voltage ($OCV_0$) of the secondary battery before pulse discharge is the same (that is, even though an SOC is the same), the discharge termination voltage ($V_f$) of the secondary battery reduces as the discharge rate increases. This is because as the discharge rate increases, an amount of energy drained from the secondary battery increases and consequently an SOC of the secondary battery reduces. However, a decreasing pattern of the discharge termination voltage ($V_f$) may change based on a voltage range to which the $OCV_0$ belongs among the three voltage ranges.

Case 1: $OCV_0$ Belongs to the First Cathode Material Voltage Range ($\Delta V_1$)

As the working ion is mainly intercalated into the first cathode material when the secondary battery is pulse discharged, the discharge termination voltage ($V_f$) reduces dependent on resistance characteristics of the first cathode material regardless of the discharge rate of the secondary battery. Thus, the I-V profile has a linearly decreasing pattern of the discharge termination voltage ($V_f$) having a negative slope as the discharge rate increase, and as the $OCV_0$ becomes lower within the first voltage range ($\Delta V_1$), the I-V profile is shifted downward.

Case 2: $OCV_0$ Belongs to the Transition Voltage Range ($\Delta V_t$)

A type of the cathode material into which the working ion is mainly intercalated when the secondary battery is pulse discharged changes from the first cathode material to the second cathode material based on the transition discharge rate.

For the convenience of description, a discharge rate range lower than the transition discharge rate is referred to as a first discharge rate range, and a discharge rate range higher than the transition discharge rate is referred to as a second discharge rate range. Also, an I-V profile observed in the first discharge rate range is referred to as a first profile, and an I-V profile observed in the second discharge rate range is referred to as a second profile.

When the second battery is pulse discharged, in case that the discharge rate belongs to the first discharge rate range, the working ion is mainly intercalated into the first cathode material similar to the Case 1. Thus, the first profile observed in the first discharge rate range shows a decreasing pattern dependent on resistance characteristics of the first cathode material. Also, a decreasing slope of the first profile is larger than that of the I-V profile of the Case 1. This is because as an amount of working ions intercalated into the first cathode material increases, resistance of the first cathode material increases. Also, as the $OCV_0$ becomes lower within the transition voltage range ($\Delta V_t$), the decreasing slope of the first profile increases. This is because with the consumption of a capacity at which the working ion can be intercalated into the first cathode material, resistance of the first cathode material further increases as the $OCV_0$ becomes lower within the transition voltage range ($\Delta V_t$). Here, an extent to which the decreasing slope of the first profile increases may change based on a type of the first cathode material.

In contrast, when the secondary battery is discharged, in case that the discharge rate belongs to the second discharge rate range, with the substantial consumption of a capacity at which the working ion can be intercalated into the first cathode material, the working ion begins to be intercalated into the second cathode material. Thus, the second profile observed in the second discharge rate range has a decreasing pattern dependent on resistance characteristics of the second cathode material. However, a decreasing slope of the second profile is smaller than the decreasing slope of the first profile.

Meanwhile, in case in which the $OCV_0$ corresponds to a lower-limit voltage of the transition voltage range ($\Delta V_t$) and the discharge rate of the secondary battery belongs to the second discharge rate range, the I-V profile observed in the second discharge rate range can be called a lower-bounded profile. This is because as the $OCV_0$ is closer to the lower-limit voltage of the transition voltage range ($\Delta V_t$), the second profile observed in the second discharge rate range converges toward the lower-bounded profile.

Also, the transition discharge rate is not fixed to a predetermined value, and tends to reduce with the $OCV_0$ of the secondary battery decreasing within the transition voltage rage ($\Delta V_t$). When the $OCV_0$ reduces, a capacity at which the working ion can be intercalated into the first cathode material reduces as much, and even if the secondary battery is discharged at a low discharge rate, the working ion begins to be intercalated into the second cathode material.

Case 3: $OCV_0$ Belongs to the Second Cathode Material Voltage Range ($\Delta V_2$)

The working ion is mainly intercalated into the second cathode material when the secondary battery is discharged regardless of the magnitude of the discharge rate. Thus, the I-V profile has a linearly decreasing pattern having a constant slope over the entire discharge rate range, and as the $OCV_0$ becomes lower within the second cathode material voltage range, a decreasing slope of the I-V profile increases. This is because with the consumption of a capacity at which the working ion can be intercalated into the second cathode material, resistance of the second cathode material increases or resistance of an anode material increases as the $OCV_0$ becomes lower within the transition voltage range ($\Delta V_t$). Here, an extent to which the decreasing slope increases may change based on a type of the second cathode material.

Preferably, when the discharging means discharges the secondary battery at discharge rates of different magnitudes, it is preferred to set each discharge rate larger than the transition discharge rate.

In the present disclosure, when the discharging means discharges the secondary battery at discharge rates of different magnitudes, it is preferred to set each discharge rate larger than a maximum value of the transition discharge rate.

In the present disclosure, when a pair of data, i.e., the discharge rate and the discharge termination voltage ($V_f$) used to approximate correlation therebetween by the linear equation is defined as I-V data, a number of the I-V data may be at least two, preferably, at least three.

Meanwhile, when the $OCV_0$ of the secondary battery belongs to the transition voltage range ($\Delta V_t$), the maximum power $P_{max}$ calculated by Equations 1 and 2 corresponds to a lower limit value of a maximum power the secondary battery can provide. Thus, the maximum power the secondary battery can actually provide has a value larger than or equal to the calculated maximum power ($P_{max}$).

The apparatus for estimating a power of a secondary battery according to the present disclosure may further include a display means connected with the control means, and the control means may output the estimated maximum power of the secondary battery through the display means. The maximum power may be displayed as a character, a number, a graph, or combinations thereof.

The apparatus for estimating a power of a secondary battery according to the present disclosure may transmit the estimated maximum power of the secondary battery to an external control unit.

The apparatus for estimating a power of a secondary battery according to the present disclosure may further include a storage means connected with the control means, and the control means may record, in the storage means, the plurality of discharge rates and discharge termination voltages ($V_f$) and/or the slope and Y intercept of the approximated linear equation and/or the estimated maximum power of the secondary battery.

The apparatus for estimating a power of a secondary battery according to the present disclosure may be included in an electric drive device.

According to one aspect, the electric drive device may be a mobile computer device such as a mobile phone, a laptop computer, and a tablet computer, or a handheld multimedia device including a digital camera, a video camera, an audio/video player, and the like.

According to another aspect, the electric drive device may be an electric transport system powered by electricity such as an electric vehicle, a hybrid vehicle, an electric bike, an electric motorcycle, an electric train, an electric boat, an electric aircraft, or a power tool including a motor such as electric drill and an electric grinder.

According to still another aspect, the electric drive device may be a large capacity energy storage system installed in an electrical grid to store new renewable energy or excess electricity, or an interruptible power supplier to supply power to various information and communication systems including a server computer or mobile communication equipment in case of emergency such as blackout.

Also, the secondary battery may further include an electrolyte including working ions, and a separator to electrically separate a cathode from an anode and allow the working ions to move.

The electrolyte is not limited to a specific type if it includes working ions and may cause an electrochemical oxidation or reduction reaction at a cathode and an anode by the medium of the working ions.

Also, the secondary battery may further include a casing to seal the cathode, the anode, and the separator. The casing does not have special limitation in its material if it has chemical safety.

An outer appearance of the secondary battery is determined by a structure of the casing. The structure of the casing may be one of the various structures known in the art, and typically, may have a cylindrical shape, a prismatic shape, a pouch shape, a coin shape, and the like.

Advantageous Effects

According to the present disclosure, even though a secondary battery including a blended cathode material exhibits a unique discharge behavior, a power of the secondary battery may be reliably estimated.

BRIEF DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

BEST MODE FOR CARRYING OUT THE INVENTION

Figure 1:
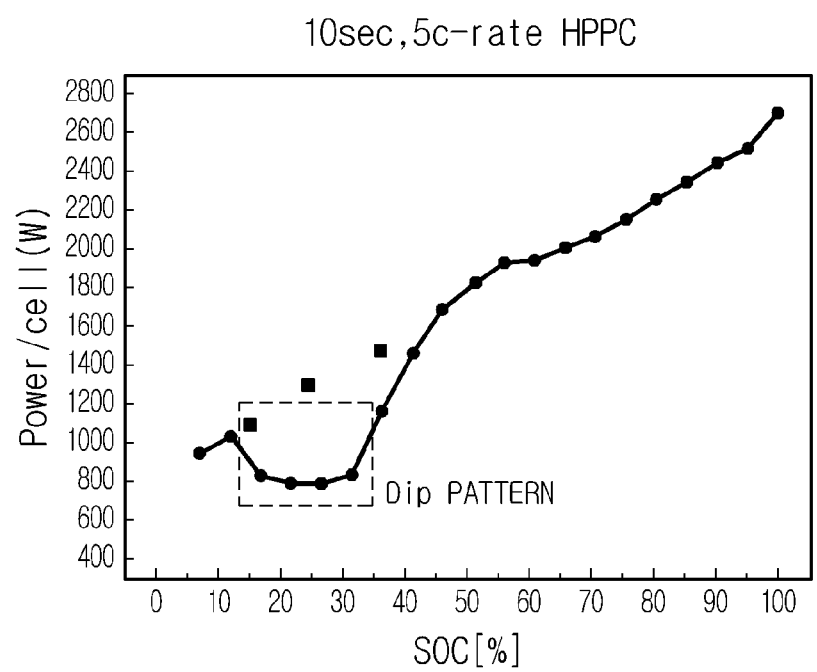
FIG. 1 is a graph showing a result of conducting a hybrid pulse power characterization (HPPC) test under pulse discharge conditions of 10 sec and 5 c to determine a maximum power of a secondary battery for each state of charge (SOC).

Hereinafter, exemplary embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

The embodiments described below dictates a case in which the technical aspects of the present disclosure are applied to a lithium secondary battery. Here, the lithium secondary battery represents a secondary battery in which a lithium ion acts as a working ion and causes an electrochemical reaction at a cathode and an anode during charge and discharging. The working ion represents an ion participating in the electrochemical oxidation and reduction reactions during charge and discharge of the secondary battery, and for example, a lithium ion may work so. Accordingly, any secondary battery using a lithium ion as a working ion should be construed as being included in the scope of the lithium secondary battery even though the name of the secondary battery changes based on a type of an electrolyte or a separator used in the lithium secondary battery, a type of a casing used to package the secondary battery, an internal or external structure of the lithium secondary battery, and the like.

Also, the present disclosure may be applied to other secondary batteries than the lithium secondary battery. Accordingly, even though an ion used as the working ion is not a lithium ion, any secondary battery to which the technical aspects of the present disclosure may be applied should be construed as being included in the scope of the present disclosure regardless of its type.

It should be noted that, in certain embodiments in which the term 'secondary battery' is used instead of the term 'lithium secondary battery', a secondary battery in the corresponding embodiments is used as a concept encompassing various types of secondary batteries.

Also, a secondary battery is not limited to a number of elements constituting the secondary battery. Accordingly, a secondary battery should be construed as including not only a unit cell including an anode, an electrolyte, and a cathode as a basic unit, but also an assembly of unit cells, a module comprising a plurality of assemblies connected in series and/or in parallel, a pack comprising a plurality of modules connected in series and/or in parallel, a battery system comprising a plurality of packs connected in series and/or in parallel, and the like.

In an exemplary embodiment of the present disclosure, a secondary battery includes $LiNi_{1/3}Co_{1/3}Mn_{1/3}O_2$ (NMC cathode material) and $LiFePO_4$ (LFP cathode material) as a first cathode material and a second cathode material, respectively. A blend ratio of the NMC cathode material and the LFP cathode material is 7:3 (weight ratio). An anode material included in the secondary battery is graphite, and as an electrolyte, an electrolyte solution is used in which a lithium salt $LiPF_6$ is added to a solvent of ethylene carbonate (EC):dimethyl carbonate (DMC):ethyl methyl carbonate (EMC) at a mix ratio of 3:4:3 (weight ratio). A separator coated with inorganic particles on a surface of a porous polyolefin substrate was used. The secondary battery was fabricated in the form of a pouch-type secondary battery, and had a capacity of 43.05 Ah. The secondary battery was manufactured to allow it to be charged and discharged in a range of 2.6 to 4.2V based on an open-circuit voltage (OCV).

FIG. 1 is a graph showing a result of conducting a hybrid pulse power characterization (HPPC) test under pulse discharge conditions of 10 sec and 5 c to determine a maximum power of a secondary battery for each state of charge (SOC).

The maximum power of the secondary battery was calculated using the following Equation 3. In Equation 3, $V_{min}$ denotes a minimum discharge voltage (=2.6V), $OCV_0$ denotes an open-circuit voltage before pulse discharge of the secondary battery, $V_f$ denotes a dynamic voltage of the secondary battery measured immediately after pulse discharge ends, $R_{dis}$ denotes an internal resistance that may be calculated from a voltage decrease amount observed during discharge of the secondary battery, and $C_{dis}$ denotes a discharge rate (5 c).

$$P_{max}=V_{min}*(OCV_0-V_{min})/R_{dis}$$

$$R_{dis}=(OCV_0-V_f)/C_{dis} \qquad \text{Equation 3}$$

Referring to FIG. 1, it can be seen that the maximum power ($P_{max}$) of the secondary battery linearly decreases with the increasing of SOC, and then exhibits a Dip pattern (see a dotted line box) when an SOC is about 15-40%. Hereinafter, the SOC range in which the Dip pattern is generated is referred to as a transition state range.

Meanwhile, a dotted line profile indicated by ■ in the transition state range shows a maximum power of the secondary battery actually measured through a constant power (CP) discharge test without using Equation 2.

Around the Dip pattern, when comparing the solid line and dotted line profiles, it can be seen that there is a considerable difference between the maximum power of the secondary battery calculated using Equation 3 and the actually measured maximum power. That is, the maximum power calculated using Equation 3 is lower than the actually measured maximum power.

Like this, the reason that the maximum power difference occurs when the secondary battery is discharged in the transition state range is because resistance characteristics of the secondary battery drastically change in the transition state range.

Figure 2:
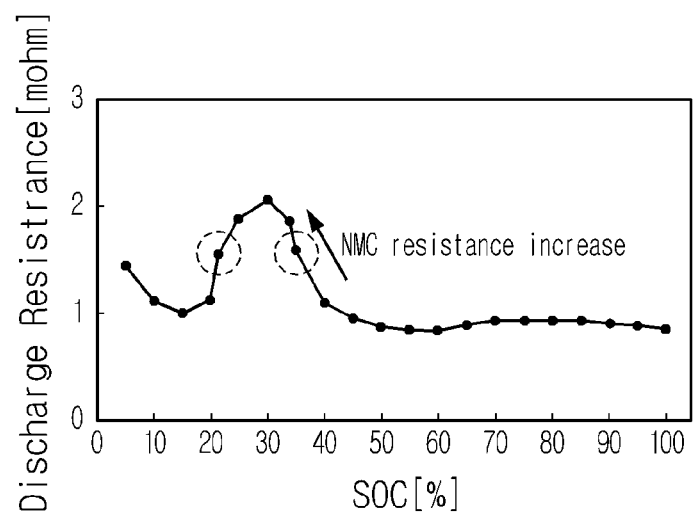
FIG. 2 is a graph showing a result of measuring an internal resistance of a secondary battery as a function of SOC during pulse discharge of the secondary battery at a discharge rate of 5 c.
Figure 3:
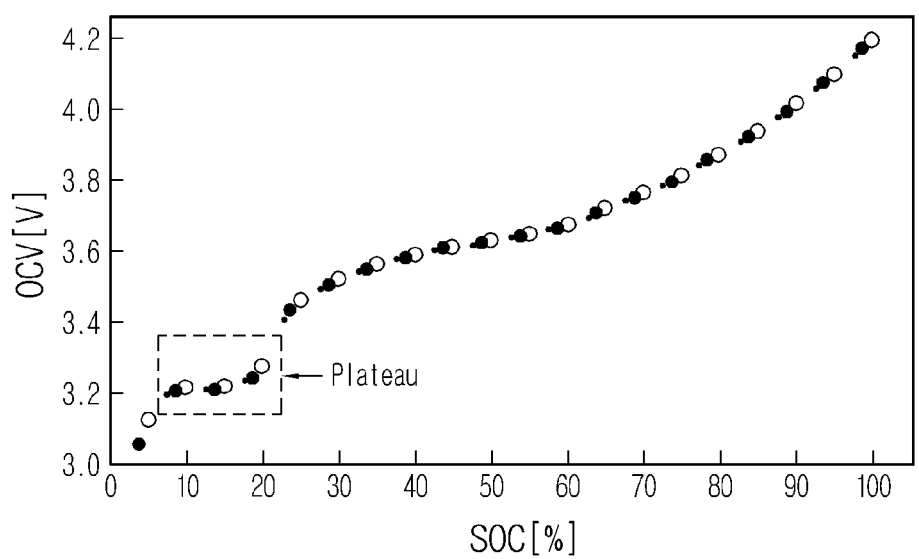
FIG. 3 is a graph showing a result of measuring an open-circuit voltage (OCV) of a secondary battery as a function of SOC during pulse discharge of the secondary battery at a discharge rate of 5 c.

FIGS. 2 and 3 are graphs showing results of measuring an internal resistance and an open-circuit voltage of the secondary battery as a function of SOC during pulse discharge of the secondary battery at a discharge rate of 5 c.

Referring to FIG. 2, it can be observed that a convex pattern of internal resistance of the secondary battery partially increasing and then decreasing is formed in the transition state range, and two inflection points (see dotted line circles) occur before and after an apex of the convex pattern.

Referring to FIG. 3, a voltage plateau (see a dotted line box) including the inflection points in the transition state range can be observed. Here, the voltage plateau represents a profile part having a small voltage change near the inflection point.

Like this, the reason that the convex pattern and the voltage plateau is observed on the internal resistance and open-circuit voltage profiles is because a type of a cathode material into which a lithium ion is intercalated during discharge of the secondary battery changes from an NMC cathode material to an LFP cathode material, and consequently, a type of a cathode material contributing to the internal resistance of the secondary battery changes.

That is, when the secondary battery is discharged in an SOC range higher than the transition state range, a lithium ion is mainly intercalated into an NMC cathode material, and as an amount of lithium ions intercalated into the NMC cathode material increases, the open-circuit voltage of the secondary battery becomes lower. In contrast, when the secondary battery is discharged in an SOC range lower than the transition state range, a lithium ion is mainly intercalated into an LFP cathode material, and as an amount of lithium ions intercalated into the LFP cathode material increases, the open-circuit voltage of the secondary battery becomes lower. Also, when the secondary battery is discharged in the transition state range, a type of a cathode material into which a lithium ion is mainly intercalated changes from an NMC cathode material to an LFP cathode material. This cathode material change occurs when the secondary battery is discharged at an SOC around an open-circuit voltage (3.2V) at which the inflection points are formed on the open-circuit voltage profile shown in FIG. 3.

Meanwhile, when more specifically observing the internal resistance convex pattern shown in FIG. 2, an SOC range (on the right side of the apex) in which the internal resistance of the secondary battery suddenly increases, and to the contrary, an SOC range (on the left side of the apex) in which the internal resistance of the secondary battery decreases again can be seen.

Here, the reason that the internal resistance of the secondary battery suddenly increases is because with the consumption of a majority of capacity for an NMC cathode material to accept a lithium ion, resistance of the NMC cathode material suddenly increases.

Also, the reason that the internal resistance of the secondary battery decreases again is because with the start of intercalation of a lithium ion into an LFP cathode material, low resistance characteristics of the LFP cathode material exhibit as the internal resistance of the secondary battery.

Further, it can be seen that when the secondary battery is discharged in an SOC range lower than the transition state range, as the SOC becomes lower, the internal resistance of the secondary battery increases again. The cause of the increased internal resistance can be found in an increasing resistance of a material used as the anode material (graphite) under the transition state range.

Figure 4:
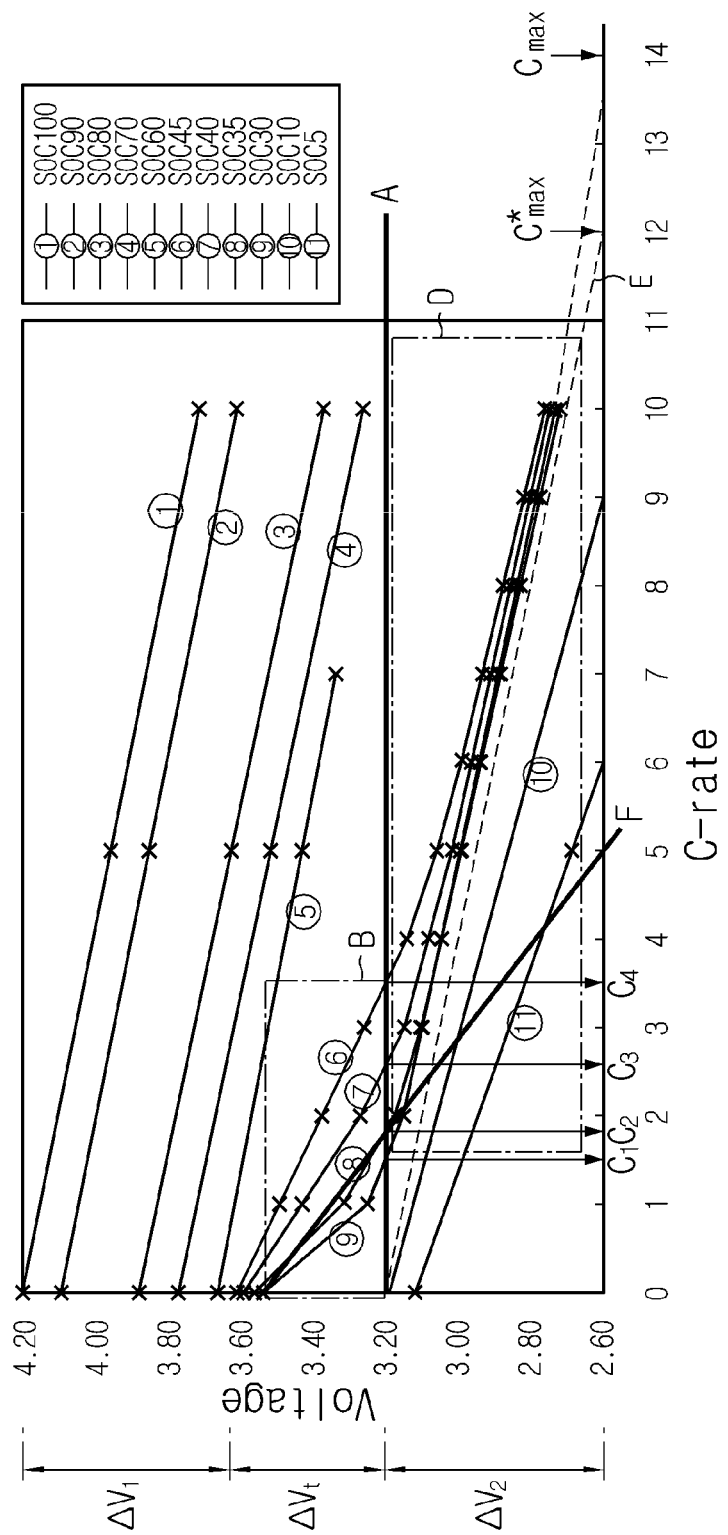
FIG. 4 is a graph showing I-V profiles for various SOC conditions, each profile obtained by plotting variation patterns of discharge termination voltage ($V_f$) measured during pulse discharge of a secondary battery at discharge rates of different magnitudes.

FIG. 4 is a graph showing I-V profiles for various SOC conditions, each profile obtained by plotting variation patterns of discharge termination voltage ($V_f$) measured during pulse discharge of the secondary battery at discharge rates of different magnitudes. A horizontal axis of the graph shown in FIG. 4 represents a discharge rate (c-rate) of the secondary battery, and a vertical axis represents a discharge termination voltage ($V_f$) of the secondary battery. On the vertical axis, a usage voltage range of the secondary battery between 2.60 and 4.20V was indicated. Here, the usage voltage range of the secondary battery may change based on types and a blend ratio of a first cathode material and a second cathode material.

The discharge termination voltage ($V_f$) represents a dynamic voltage of the secondary battery measured immediately after pulse discharge of the secondary battery for 10 seconds. Also, when discharging the secondary battery in a pulse current under numerous discharge rate conditions, an open-circuit voltage ($OCV_0$) of the secondary battery before the start of pulse discharge was set to be equal. Thus, a plurality of points on the same profile indicates a result of measuring the discharge termination voltage ($V_f$) during pulse discharge at different discharge rates under the same initial condition (i.e., $OCV_0$ is the same).

In FIG. 4, a point where each profile intersects a Y axis indicates the open-circuit voltage ($OCV_0$) of the secondary battery before the start of pulse discharge. For example, the I-V profile (①) corresponding to SOC 100% shows how the discharge termination voltage ($V_f$) changes while the secondary battery is discharged for 10 seconds under the conditions of discharge rates of 5 c and 10 c respectively when the $OCV_0$ of the secondary battery is 4.20V.

The usage voltage range indicated on the vertical axis of FIG. 4 may be divided into a first voltage range ($\Delta V_1$), a transition voltage range ($\Delta V_t$), and a second voltage range ($\Delta V_2$).

An I-V profile in which the Y intercept (i.e., $OCV_0$) belongs to the first voltage range ($\Delta V_1$) and the second voltage range ($\Delta V_2$) has a decreasing pattern of the discharge termination voltage ($V_f$) having a constant slope. In contrast, a profile in which the Y intercept (i.e., $OCV_0$) belongs to the transition voltage range ($\Delta V_t$) has such a pattern that a decreasing slope of the discharge termination voltage ($V_f$) changes.

First, when the $OCV_0$ of the secondary battery belongs to the first voltage range ($\Delta V_1$), while the secondary battery is pulse discharged, a working ion is mainly intercalated into an NMC cathode material. Thus, irrespective of a discharge rate of the secondary battery, the discharge termination voltage ($V_f$) decreases while showing dependency on resistance characteristics of the NMC cathode material. Thus, it can be seen that the I-V profiles (①-⑤) have a linearly decreasing pattern having a predetermined constant slope with increasing of the discharge rate, and within the first voltage range ($\Delta V_1$), as the $OCV_0$ becomes lower, the I-V profiles are shifted downward.

Subsequently, when the $OCV_0$ of the secondary battery belongs to the transition voltage range ($\Delta V_t$), while the secondary battery is pulse discharged, a type of a cathode material into which a working ion is intercalated changes from an NMC cathode material to an LFP cathode material based on a transition discharge rate ($C_1$-$C_4$). Here, the transition discharge rate ($C_1$-$C_4$) represents a discharge rate at a point where the I-V profiles (⑥-⑨) intersect with a horizontal straight line (A) having, as a Y intercept, the open-circuit voltage (about 3.2V) indicated as the voltage near which the voltage plateau is observed on the open-circuit voltage profile shown in FIG. 3. The transition discharge rates ($C_1$-$C_4$) are shifted leftward as the $OCV_0$ of the secondary battery gets lower. This is because if the $OCV_0$ decreases, a capacity at which a working ion can be intercalated into an NMC cathode material reduces as much, and even if the secondary battery is discharged at a low discharge rate, a working ion is readily intercalated into an LFP cathode material.

Hereinafter, for the convenience of description, a discharge rate range lower than the transition discharge rate is referred to as a first discharge rate range, and a discharge rate range higher than the transition discharge rate is referred to as a second discharge rate range. Also, an I-V profile observed in the first discharge rate range is referred to as a first profile (B), and an I-V profile observed in the second discharge rate range is referred to as a second profile (D).

When the second battery is pulse discharged, in case that the discharge rate belongs to the first discharge rate range, a working ion is still intercalated into an NMC cathode material. Thus, the first profile (B) observed in the first discharge rate range shows a decreasing pattern dependent on resistance characteristics of the NMC cathode material. Also, the decreasing slope of the first profile (B) is larger than the I-V profiles (①-⑤). This is because with the increasing amount of working ions intercalated into an NMC cathode material, resistance of the NMC cathode material increases. Also, the decreasing slope of the first profile (B) increases as the $OCV_0$ gets lower within the transition voltage range ($\Delta V_t$). This is because as the $OCV_0$ becomes lower within the transition voltage range ($\Delta V_t$), with the consumption of a capacity at which a working ion can be intercalated into an NMC cathode material, resistance of the NMC cathode material further increases. Here, an extent to which the decreasing slope of the first profile (B) increases may change based on a type of the first cathode material.

In contrast, when the secondary battery is discharged, in case that the discharge rate belongs to the second discharge rate range, with the substantial consumption of a capacity at which a working ion can be intercalated into an NMC cathode material, a working ion begins to be intercalated into an LFP cathode material. Thus, the second profile (D) observed in the second discharge rate range has a decreasing pattern while showing dependency on resistance characteristics of the LFP cathode material. However, the decreasing slope of the second profile (D) is smaller than the decreasing slope of the first profile (B).

Meanwhile, in case that the $OCV_0$ corresponds to a lower-limit voltage (around 3.2V) of the transition voltage range ($\Delta V_t$) and the discharge rate of the secondary battery belongs to the second discharge rate range, the I-V profile (E) observed in the second discharge rate range can be called a lower-bounded profile. This is because as the $OCV_0$ is closer to the lower-limit voltage of the transition voltage range ($\Delta V_t$), the I-V profile observed in the second discharge rate range converges to the lower-bounded profile.

Subsequently, when the $OCV_0$ of the secondary battery belongs to the second voltage range ($\Delta V_2$), while the secondary battery is pulse discharged, a working ion is mainly intercalated into an LFP cathode material irrespective of a magnitude of a discharge rate. Thus, the I-V profiles (⑩-⑪) have a linearly decreasing pattern having a predetermined constant slope over the total discharge rate range, and the slope of the I-V profiles (⑩-⑪) increases as the $OCV_0$ becomes lower within the second voltage range ($\Delta V_2$). This is because as the $OCV_0$ becomes lower, resistance of a material used as an anode material increases and the internal resistance of the secondary battery increases.

The I-V profile illustrated in FIG. 4 shows how the voltage of the secondary battery changes based on a magnitude of a discharge rate, and accordingly, the slope of the I-V profile substantially corresponds to the internal resistance of the secondary battery.

Because the I-V profiles ①-② and ⑩-⑪ have a constant slope, even if the discharge rate of the secondary battery changes, the internal resistance of the secondary battery can be said to be constant. In contrast, the I-V profiles ⑥-⑨ have a decreasing slope with the increasing discharge rate of the secondary battery and converge to the lower-bounded profile (E). Thus, when the $OCV_0$ of the secondary battery belong to the transition voltage range ($\Delta V_t$), while the secondary battery is discharged, the internal resistance of the secondary battery can be said to gradually decrease with the increasing discharge rate and converge to a predetermined value.

A maximum power of the secondary battery may be calculated by a multiplication operation of a minimum discharge voltage ($V_{min}$) and a maximum discharge rate ($C_{max}$) causing the secondary battery to drop down to the minimum discharge voltage (2.6V).

The maximum discharge rate ($C_{max}$) corresponds to a discharge rate (that is, an X axis intersection discharge rate) at a point where the profiles shown in FIG. 4 meet an X axis when extending in an X axial direction.

The X axis intersection discharge rate ($C_{max}$) corresponds to ($OCV_0-V_{min}$)/$R_{dis}$ of the above Equation 3, and a denominator $R_{dis}$ may be calculated in real time using a mathematical formula ($OCV_0-V_f$)/$C_{dis}$ by sampling the discharge rate and the discharge termination voltage ($V_f$) during discharge of the secondary battery.

When the $OCV_0$ of the secondary battery belongs to the first voltage range ($\Delta V_1$) or the second voltage range ($\Delta V_2$), the discharge termination voltage ($V_f$) of the secondary battery decreases at a predetermined slope irrespective of a magnitude of a discharge rate, and thus, even if the maximum power of the secondary battery is estimated in real time using Equation 3, a difference with an actually measured maximum power does not occur. However, when the $OCV_0$ of the secondary battery belongs to the transition voltage range ($\Delta V_t$), if the maximum power is estimated using Equation 3, a difference with an actually measured maximum power occurs.

For example, when the $OCV_0$ of the secondary battery is 3.55V, while the secondary battery is discharged, the discharge termination voltage ($V_f$) changes along the I-V profile ⑨ with the increasing discharge rate. Also, when the I-V profile ⑨ extends in an X axis direction, if an X axis intersection discharge rate ($C_{max}$) is calculated, a discharge rate of about 14 c may be obtained and it is substantially the same as an actually measured maximum discharge rate. However, if an internal resistance $R_{dis}$ of the secondary battery is calculated from a discharge termination voltage ($V_f$) measured when the secondary battery is discharged at a discharge rate of 2 c, and a maximum discharge rate is calculated by a mathematical formula ($OCV_0-V_{min}$)/$R_{dis}$, its value corresponds to a discharge rate (about 5 c) at a point where a straight line F meets the X axis when extending in an X axis direction and the value is quite smaller than a maximum discharge rate 14 c at a point where the I-V profile ⑨ meets the X axis. Thus, when the $OCV_0$ of the secondary battery including the blended cathode material belongs to the transition voltage range ($\Delta V_t$), if a maximum power is estimated using the maximum discharge rate calculated in real time using Equation 3, there is a problem with the estimated maximum power lower than an actually measured maximum power. Therefore, in case that the $OCV_0$ of the secondary battery belongs to the transition voltage range ($\Delta V_t$), a new approach to estimate the maximum power of the secondary battery is needed.

The inventors of the present application have noted the fact that when the $OCV_0$ of the secondary battery belongs to the transition voltage range ($\Delta V_t$), the second profile (D) observed in the second discharge rate range converges to the lower-bounded profile (E), the X axis intersection discharge rate ($C_{max}$) of the second profile (D) is substantially the same as an actually measured maximum discharge rate of the secondary battery, and the X axis intersection discharge rate of the second profile (D) converges to an approximately discharge rate ($C^*_{max}$) at a point where the lower-bounded profile (E) meets the X axis.

Also, the inventors of the present application have verified that in the real-time estimation of the maximum power of the secondary battery, an error may be minimized by sampling a plurality of discharge termination voltages ($V_f$) from a plurality of discharge rates (c) having a sufficiently large magnitude, obtaining a profile approximated by a two-dimensional linear equation "$V_f=-R_{dis}*c+OCV_0$" using the sampled data, obtaining a maximum discharge rate ($C_{max}$) of the secondary battery by a mathematical formula $C_{max}=$ ($OCV_0-V_{min}$)/$R_{dis}$ by using a Y intercept $OCV_0$ and a slope $R_{dis}$ of the linear equation, and a minimum discharge voltage $V_{min}$ of the secondary battery, and estimating a maximum power ($P_{max}$) of the secondary battery by a mathematical formula $P_{max}=C_{max}*V_{mm}$.

Hereinafter, a detailed description of an apparatus for estimating a power of a secondary battery according to the present disclosure designed based on the above-mentioned conventional problem and new experimental findings is provided.

Figure 5:
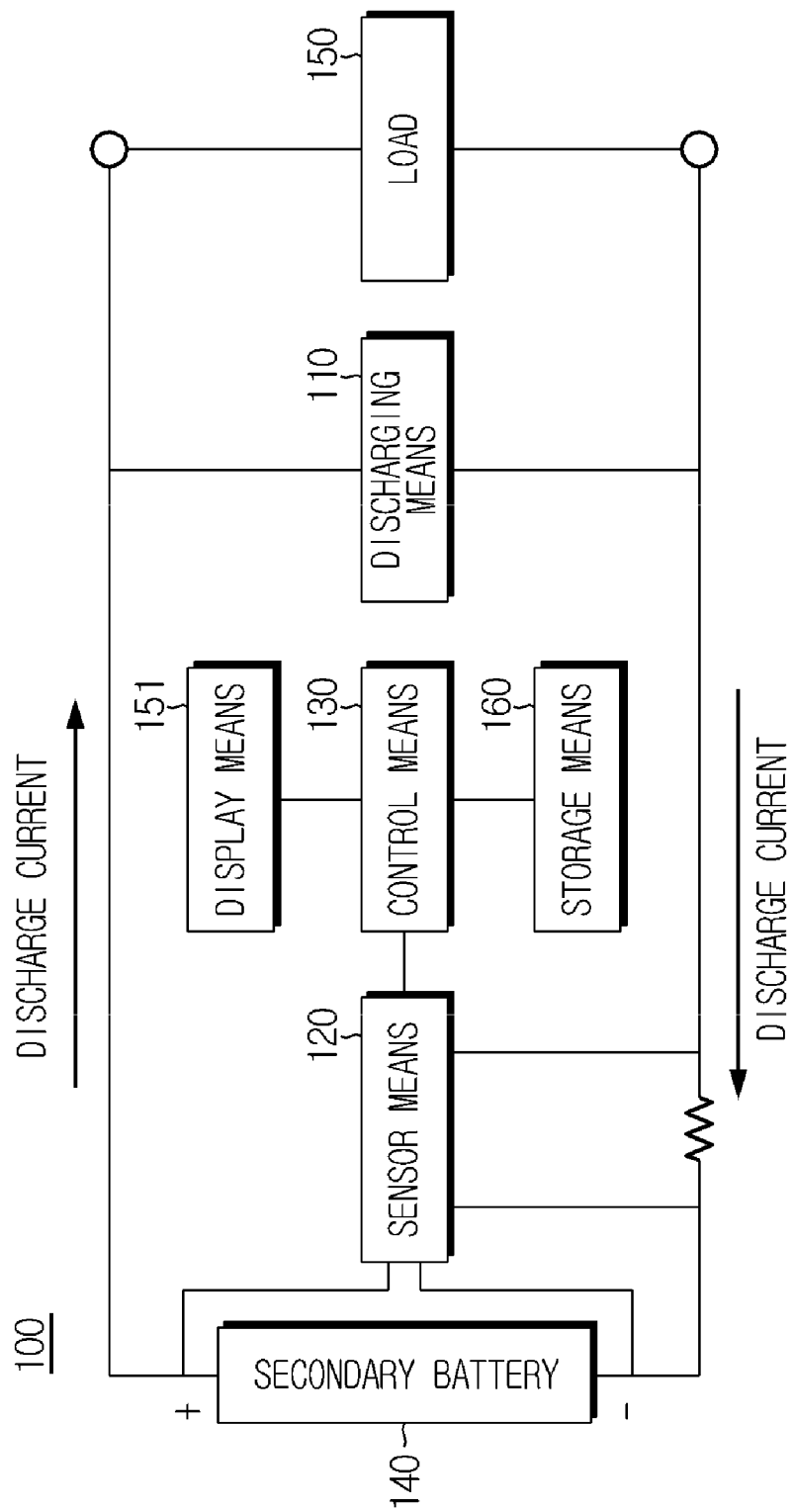
FIG. 5 is a block diagram illustrating a structure of an apparatus for estimating a power of a secondary battery according to an exemplary example of the present disclosure.

FIG. 5 is a block diagram illustrating a structure of an apparatus 100 for estimating a power of a secondary battery according to an exemplary example of the present disclosure.

Referring to FIG. 5, the apparatus 100 for estimating a power of a secondary battery according to the present disclosure includes a discharging means 110, a sensor means 120, and a control means 130.

To estimate a maximum power of a secondary battery 140 including a blended cathode material, the apparatus 100 may be connected between the secondary battery 140 and a load 150.

The secondary battery 140 may be a lithium secondary battery. However the present disclosure is not limited to a battery type.

The secondary battery 140 may be mounted in various types of electric drive devices capable of working by electrical energy, and the electric drive device is not limited to a specific type.

In one embodiment, the electric drive device may be a mobile computer device such as a mobile phone, a laptop computer, and a tablet computer, or a handheld multimedia device including a digital camera, a video camera, and an audio/video player device.

In another embodiment, the electric drive device may be an electric-powered device capable of moving by electricity, such as an electric vehicle, a hybrid vehicle, an electric bike, an electric motorcycle, an electric train, an electric boat, and an electric aircraft, or a power tool including a motor such as an electric drill and an electric grinder.

In still another embodiment, the electric drive device may be a large capacity energy storage system installed in an electrical grid to store electricity generated through new renewable energy or excess electricity of a power plant, and an uninterruptible power supplier to supply power to various types of information and communication devices including a server computer and mobile communication equipment in case of emergency, for example, a blackout.

The load 150 is included in various types of electric drive devices, and is an energy consumption device included in the electric drive device that works by electrical energy supplied when the secondary battery 140 is discharged. The load 150 may be, as a non-limiting example, a rotary drive device such as a motor or a power conversion device such as an inverter, however the present disclosure is not limited to a load type.

The discharging means 110 pulse discharges the secondary battery 140 with a discharge current of a plurality of different discharge rates (C-rate) at a time interval under the control of the control means 130. Here, at least two discharge rates are preferred. Also, a pulse discharge time and a discharge rest time may be arbitrarily set. For example, the pulse discharge time and the discharge rest time may be each set to 10 seconds. The discharging means 110 may receive a control signal for controlling the discharge rate of the secondary battery 140 from the control means 130. When the control signal is received, the discharging means 110 changes the discharge rate of the secondary battery 140 from one value to another.

Preferably, the discharge rate condition applied when the discharging means 110 discharges the secondary battery 140 is enough large. For example, the discharge rate condition is set to be larger than a maximum value of a transition discharge rate observed on an I-V profile of the secondary battery 140.

As a non-limiting example, when the blended cathode material includes an LMC cathode material and an LFP cathode material at a ratio of 7:3 (weight ratio), it is preferred that the discharge rate condition is larger than or equal to 5 c (see FIG. 4).

As a non-limiting example, when the discharge rate condition is larger than or equal to 5 c, the discharge rate condition may be set to 6 c and 8 c (two), or 6 c, 8 c, and 10 c (three).

The discharging means 110 may be, for example, a means that adjustably controls a magnitude of a load current being supplied to the load 150. The means for controlling the magnitude of the load current may be easily implemented through a known circuit, and its detailed description is omitted herein.

As another example, the discharging means 110 may include a discharge circuit and may be a means for forcibly discharging the secondary battery 140 at different discharge rates.

In the latter case, the discharge circuit may include a plurality of resistor components, and the discharging means 110 may control a discharge rate of a discharge current through selective connection of the resistor components.

The sensor means 120 measures, under the control of the control means 130, a discharge termination voltage ($V_f$) of the secondary battery when each pulse discharge ends. Preferably, the sensor means 120 includes a voltage measurement circuit to measure a voltage across a cathode and an anode of the secondary battery 140.

The discharge termination voltage ($V_f$) represents a dynamic voltage of the secondary battery measured at the point in time when application of pulse discharge is terminated. If the discharge condition is set to n, a number of the measured discharge termination voltages ($V_f$) is also n.

The sensor means 120 may output the measured discharge termination voltage ($V_f$) to the control means 130. The sensor means 120 may receive a control signal for measuring the discharge termination voltage ($V_f$) from the control means 130. When the control signal is received, the sensor means 120 measures the discharge termination voltage ($V_f$) and outputs it to the control means 130.

The control means 130 obtains a plurality of discharge termination voltages ($V_f$) measured under a plurality of discharge rate conditions by controlling the discharging means 110 and the sensor means 120.

Also, the control means 130 approximates correlation between the plurality of discharge rates (c) and the plurality of discharge termination voltages ($V_f$) corresponding thereto as a two-dimensional linear equation "$V_f = -R_{dis}*c + OCV_0$". In the linear equation, the discharge rate (c) and the discharge termination voltage ($V_f$) denote input and output variables, and $-R_{dis}$ and $OCV_0$ denote a slope and a Y intercept, respectively.

Also, the control means 130 extrapolates an open-circuit voltage ($OCV_0$) when the discharge rate is 0 using the linear equation. Here, the open-circuit voltage ($OCV_0$) is a voltage before pulse discharge of the secondary battery 140, and represents an open-circuit voltage in a substantially no-load state.

Also, the control means 130 calculates, based on a minimum discharge voltage ($V_{min}$), an offset ($OCV_0 - V_{min}$) of the open-circuit voltage ($OCV_0$), and calculates a maximum discharge rate ($C_{max}$) of the secondary battery using the offset and the slope ($R_{dis}$) of the linear equation. Here, the maximum discharge rate ($C_{max}$) represents a discharge rate allowing the voltage of the secondary battery 140 to drop down to the minimum discharge voltage ($V_{min}$). Subsequently, the control means 130 estimates a maximum power ($C_{max}*V_{min}$) of the secondary battery using the calculated maximum discharge rate ($C_{max}$) and the minimum discharge voltage ($V_{min}$).

The apparatus 100 for estimating a power of a secondary battery may further include a storage means 160. The storage means 160 is not limited to a specific type if it is a storage medium capable of recording and erasing information.

As an example, the storage means 160 may be random access memory (RAM), read-only memory (ROM), a register, a hard disc, an optical recording medium, or a magnetic recording medium.

Also, the storage means 160 may be connected to the control means 130 via, for example, a data bus, to allow access by the control means 130.

Also, the storage means 160 may store and/or update and/or erase and/or transmit programs including various control logics executed by the control means 130, and/or data generated by execution of the control logics.

The storage means 160 may be logically divided into at least two, and is not limited as being included in the control means 130.

The storage means 160 may include data associated with the different discharge rate conditions, data associated with the plurality of discharge end voltages ($V_f$) measured by the sensor means 120, data associated with the slope and Y intercept of the two-dimensional linear approximation equation and the lower-limit discharge voltage ($V_{min}$), and data associated with the calculated maximum discharge rate and maximum power.

To execute various control logics and/or calculation logics, the control means 130 may optionally include a processor, an application-specific integrated circuit (ASIC), a chipset, a logic circuit, a register, a communication modem, and a data processing device, well known in the art. Also, when the control logic is implemented in software, the control means 130 may be implemented as an assembly of program modules. In this instance, the program module may be stored in a memory and executed by a processor. The memory may be disposed inside or outside a processor, and may be connected to a processor by various known means. Also, the memory may be included in the storage means 160. Also, the memory generally represents all devices storing information regardless of a device type, and does not indicate a specific memory device.

Optionally, the apparatus 100 for estimating a power of a secondary battery may further include a display means 150. The display means 150 is not limited to a specific type if it can display information about the maximum power of the secondary battery 140 estimated by the control means 130 as graphical interface. As an example, the display means 150 may be a liquid crystal display (LCD), a light-emitting diode (LED) display, an organic light-emitting diode (OLED) display, an electrophoretic ink (E-Ink) display, a flexible display, and the like. The display means 151 may be connected with the control means 130 directly or indirectly. When the latter is employed, the display means 151 may be located in a physically separate area from an area where the control means 130 is located. Also, a third control means (not shown) may be interposed between the display means 151 and the control means 130 to receive information to be displayed on the display means 151 from the control means 130 and allow the information to be displayed on the display means 151. For this, the third control means may be connected to the control means 130 via a communication line.

The display means 151 is not necessarily included in the apparatus according to the present disclosure, and may be included in other apparatus connected with the apparatus according to the present disclosure. In this case, the display means 151 may be indirectly connected to the control means 130 with a medium of a control means included in other apparatus rather than being directly connected. Accordingly, it should be understood that an electrical connection of the display means 151 and the control means 130 includes this indirect connection method.

The control means 130 may form a communication interface with an external control device. Also, through the communication interface, data associated with the maximum discharge rate and/or the maximum power of the secondary battery may be transmitted to the external control means. The external control means may be a control means of a device equipped with the load 150. As an example, in the case where the secondary battery 140 is mounted in an electric vehicle, the control means 130 may transmit data associated with the maximum discharge rate and/or the maximum power of the secondary battery 140 to a control unit that controls an operating mechanism of the electric vehicle in an integrated manner. Then, the control unit may maximize discharge efficiency of the secondary battery 140 using the received maximum discharge rate and/or maximum power of the secondary battery 140.

In the description of various embodiments of the present disclosure, it should be understood that elements called 'means' are distinguished functionally rather than physically. Accordingly, each element may be selectively integrated with other element, or each element may be divided into sub-elements for efficient execution of the control logic(s). However, it is obvious to a person having ordinary skill in the art that even though elements are integrated or divided, if functions are found to be identical, the integrated or divided elements should be construed as falling within the scope of the present disclosure.

A selective combination of at least one of the various control logics and/or calculation logics of the control means 130 may become an embodiment of a method for estimating a power of a secondary battery according to the present disclosure.

Figure 6:
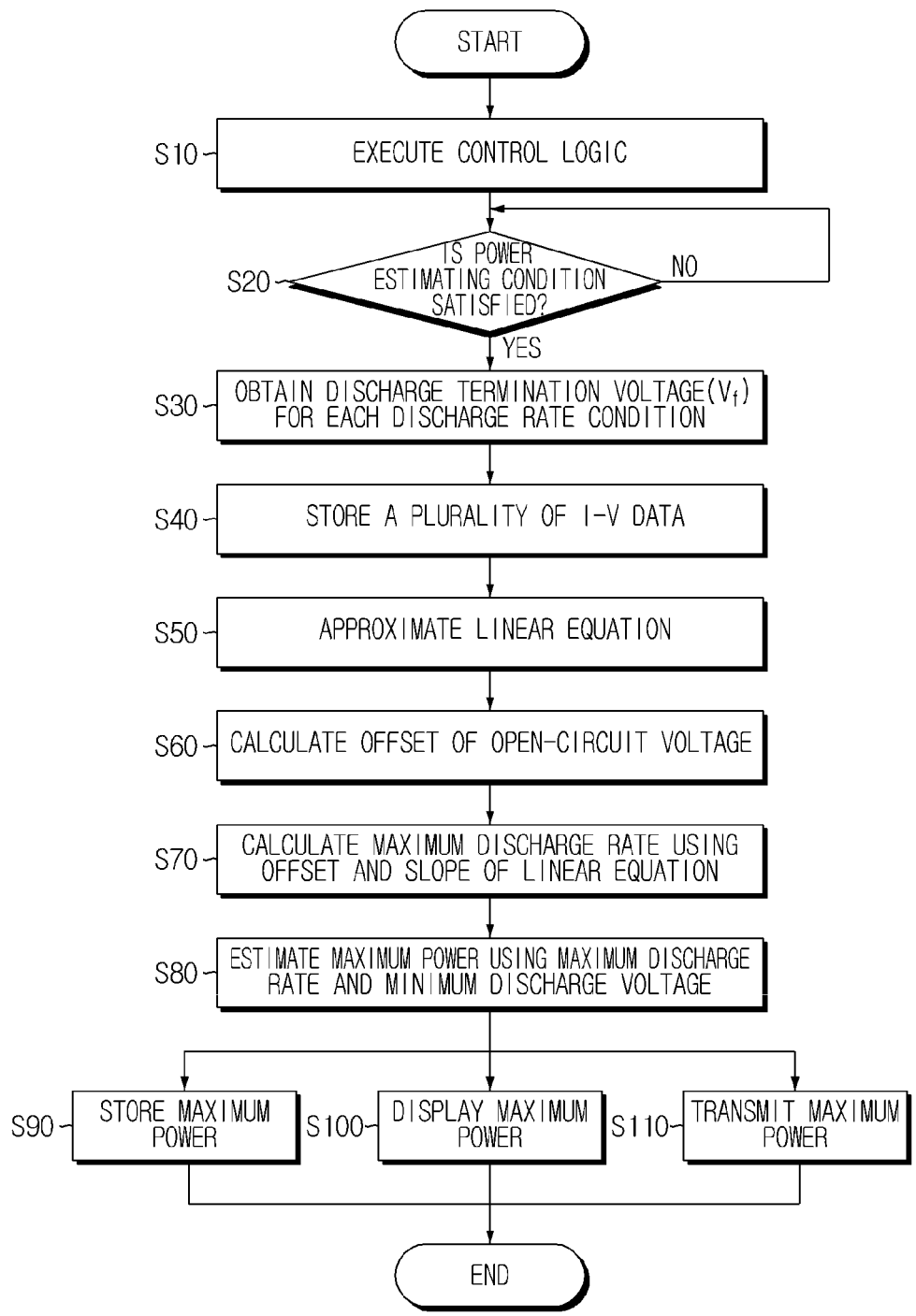
FIG. 6 is a flowchart illustrating a method for estimating a power of a secondary battery according to an exemplary example of the present disclosure.

FIG. 6 is a flowchart chronologically illustrating a method of estimating a maximum power of a secondary battery according to an exemplary embodiment of the present disclosure.

First, in S10, the control means 130 reads control logic needed to estimate a maximum power of a secondary battery from the storage means 160 and executes the control logic.

Subsequently, in S20, the control means 130 determines whether a condition for estimating a power is satisfied. Here, the estimating condition may include a condition under which the secondary battery will be maintained in a no-load state for at least a predetermined time (from tens of seconds to a few minutes). Optionally, S20 may be omitted.

In S20, when the estimating condition is determined to be satisfied, the control means 130 goes on to S30 in the process. On the contrary, in S20, when the estimating condition is not determined to be satisfied, the control means 130 goes to S20 in the process.

In S30, the control means 120 obtains a discharge termination voltage ($V_f$) of the secondary battery for each discharge rate condition by pulse discharging the secondary battery 140 under a plurality of different discharge rate conditions by controlling the discharging means 110 and the sensor means 120.

Here, a discharge rate condition and a discharge end voltage ($V_f$) corresponding thereto form I-V data. Thus, if the secondary battery 140 is pulse discharged under three different discharge rate conditions, the control means 120 obtains three I-V data.

Preferably, the plurality of discharge rate conditions is enough large. As an example, it is preferred that the plurality of discharge rate conditions is larger than a maximum value of a transition discharge rate observed on an I-V profile of the secondary battery 140.

In S40, the control means 130 records, in the storage means 160, the plural I-V data obtained in S30. Subsequently, in S50, the control means 130 approximately calculates a linear equation "$V_f = -R_{dis}*c + OCV_0$" defining a correlation between a discharge rate (c) and a discharge termination voltage ($V_f$) using the plural I-V data.

Subsequently, in S60, the control means 130 calculates an open-circuit voltage ($OCV_0$) when the discharge rate is 0 from the linear equation, and calculates an offset of the open-circuit voltage ($OCV_0$) based on a minimum discharge voltage ($V_{min}$).

Subsequently, in S70, the control means 130 calculates a maximum discharge rate ($C_{max}$) of the secondary battery using the offset value and the slope ($R_{dis}$) of the linear equation. Subsequently, in S80, the control means 130 estimates a maximum power ($C_{max}*V_{min}$) using the maximum discharge rate ($C_{max}$) and the minimum discharge voltage ($V_{min}$).

Meanwhile, the control means 130 may optionally perform S90 and/or S100 and/or S110. That is, in S90, the control means 130 may record the estimated maximum power of the secondary battery 140 in the storage means 160. Also, in S100, the control means 130 may output the estimated maximum power of the secondary battery 140 as graphical interface through the display means 151. Also, the control means 130 may transmit the estimated maximum power of the secondary battery 140 to an external control unit.

In the present disclosure, at least one of various control logics and/or calculation logics of the control means 130 may be selectively combined, and the combined control logics may be written in a computer-readable code and recorded in a computer-readable recording medium.

The recording medium is not limited to a specific type if it is accessible by a processor included in a computer. As an example, the recording medium may include at least one selected from the group consisting of ROM, RAM, a register, a compact disc read-only memory (CD-ROM), a magnetic tape, a hard disc, a floppy disc, and an optical data recording device.

Also, the computer-readable code may be modulated to a carrier signal and included in a communication carrier at a particular point in time, and may be distributed over network-coupled computer systems so that the computer-readable code is stored and executed in a distributed fashion. Also, functional programs, codes, and code segments for implementing the combined control logics may be easily inferred by programmers in the technical field to which the present disclosure belongs.

Hereinabove, the present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An apparatus for estimating a power of a secondary battery including a blended cathode material including at least a first cathode material and a second cathode material, the apparatus comprising:
  a discharging means configured to discharge a secondary battery under conditions of a plurality of discharge rates different from each other and larger than a transition discharge rate corresponding to a state of charge (SOC) of the secondary battery, wherein a cathode material into which a working ion is mainly intercalated changes from the first cathode material to the second cathode material based on the transition discharge rate when the secondary battery is discharged;
  a sensor means configured to measure a plurality of discharge termination voltages corresponding to the conditions of the plurality of discharge rates; and
  a control means configured to approximate a correlation between the plurality of discharge rates and the plurality of discharge termination voltages by a two-dimensional linear equation, calculate a maximum discharge rate of the secondary battery corresponding to a minimum discharge voltage using the linear equation, and estimate a maximum power of the secondary battery from the calculated maximum discharge rate.

2. The apparatus for estimating a power of a secondary battery according to claim 1, wherein the discharging means is configured to pulse discharge the secondary battery under the conditions of the plurality of discharge rates different from each other.

3. The apparatus for estimating a power of a secondary battery according to claim 1, wherein a discharge resistance profile of the secondary battery has a convex pattern.

4. The apparatus for estimating a power of a secondary battery according to claim 1, wherein an open-circuit voltage profile of the secondary battery has at least one voltage plateau.

5. The apparatus for estimating a power of a secondary battery according to claim 1, wherein voltage ranges of the first cathode material and the second cathode material reacting with working ions of the secondary battery in a discharge mode differ.

6. The apparatus for estimating a power of a secondary battery according to claim 1, wherein the control means is configured to approximate the linear equation using at least two pairs of discharge rates and discharge termination voltages.

7. The apparatus for estimating a power of a secondary battery according to claim 1, wherein the conditions of the plurality of discharge rates are larger than a maximum value of a transition discharge rate observed on an I-V profile measured for each state of charge of the secondary battery.

8. The apparatus for estimating a power of a secondary battery according to claim 1, wherein the control means is configured to calculate the maximum discharge rate using the following equation:

Maximum discharge rate $(C_{max})$=($Y$ intercept of linear equation−minimum discharge voltage)/absolute value of linear equation slope.

9. The apparatus for estimating a power of a secondary battery according to claim 1, wherein the control means is configured to estimate the maximum power using the following equation:

$P_{max}$=maximum discharge rate*minimum discharge voltage={($Y$ intercept of linear equation−minimum discharge voltage)/absolute value of linear equation slope}*minimum discharge voltage.

10. The apparatus for estimating a power of a secondary battery according to claim 1, further comprising:
  a display means connected with the control means,
  wherein the control means is configured to output the estimated maximum power of the secondary battery through the display means.

11. The apparatus for estimating a power of a secondary battery according to claim 1, wherein the control means is configured to transmit the estimated maximum power of the secondary battery to an external control unit.

12. The apparatus for estimating a power of a secondary battery according to claim 1, further comprising:
  a storage means connected with the control means,
  wherein the control means is configured to record, in the storage means, the plurality of discharge rates and discharge termination voltages, the slope and Y intercept of the approximated linear equation, or the estimated maximum power of the secondary battery.

13. The apparatus for estimating a power of a secondary battery according to claim 1,
  wherein the first cathode material is an alkali metal compound represented by a general chemical formula A$[A_xM_y]O_{2+z}$,
  wherein A includes at least one element of Li, Na and K; M includes at least one element selected from Ni, Co, Mn, Ca, Mg, Al, Ti, Si, Fe, Mo, V, Zr, Zn, Cu, Al, Mo, Sc, Zr, Ru, and Cr; x, y and z satisfy inequality equations of x≥0, 1≤x+y≤2 and −0.1≤z≤2, respectively; and x, y, z, and stoichiometric coefficients of components included in M are selected for the compound to maintain electrical neutrality, and the second cathode material is lithium metal phosphate represented by a general chemical formula $Li_aM^1{}_xFe_{1-x}M^2{}_yP_{1-y}M^3{}_zO_{4-z}$,
  wherein $M^1$ includes at least one element selected from Ti, Si, Mn, Co, Fe, V, Cr, Mo, Ni, Nd, Al, Mg, and Al; $M^2$ includes at least one element selected from Ti, Si, Mn, Co, Fe, V, Cr, Mo, Ni, Nd, Al, Mg, Al, As, Sb, Si, Ge, V, and S; $M^3$ includes at least one element selected from halogen group elements including F; a, x, y and z satisfy inequality equations of 0<a≤2, 0≤x≤1, 0≤y<1 and 0≤z<1, respectively; and a, x, y, z, and stoichiometric coefficients of components included in $M^1$, $M^2$, and $M^3$ are selected for the compound to maintain electrical neutrality, or $Li_3M_2(PO_4)_3$, and
  wherein M includes at least one element selected from Ti, Si, Mn, Fe, Co, V, Cr, Mo, Ni, Mg, and Al.

14. An electric drive device comprising the apparatus for estimating a power of a secondary battery according to claim 1.

15. A method for estimating a power of a secondary battery including a blended cathode material of at least a first cathode material and a second cathode material, the method comprising:
  (a) discharging a secondary battery under conditions of a plurality of discharge rates different from each other and larger than a transition discharge rate corresponding a state of charge (SOC) of the secondary battery, wherein a cathode material into which a working ion is mainly intercalated changes from the first cathode material to the second cathode material based on the transition discharge rate when the secondary battery is discharged;

(b) measuring a plurality of discharge termination voltages corresponding to the conditions of the plurality of discharge rates;

(c) approximating a correlation between the plurality of discharge rates and the plurality of discharge termination voltages by a two-dimensional linear equation, and calculating a maximum discharge rate ($C_{max}$) of the secondary battery corresponding to a minimum discharge voltage ($V_{min}$) using the linear equation;

(d) estimating a maximum output of the secondary battery from the calculated maximum discharge rate; and (e) storing the estimated maximum output into a storage means.

16. The method for estimating a power of a secondary battery according to claim 15, wherein the step (a) comprises pulse discharging the secondary battery under the conditions of the plurality of discharge rates different from each other.

17. The method for estimating a power of a secondary battery according to claim 15, wherein the step (c) comprises approximating the linear equation using at least two pairs of discharge rates and discharge end voltages.

18. The method for estimating a power of a secondary battery according to claim 15, wherein in the step (a), the conditions of the plurality of discharge rates are larger than a maximum value of a transition discharge rate observed on an I-V profile measured for each state of charge of the secondary battery.

19. The method for estimating a power of a secondary battery according to claim 15, wherein the step (d) comprises estimating the maximum power of the secondary battery using the following equation:

$$P_{max} = \text{maximum discharge rate} * \text{minimum discharge voltage} = \{(Y\text{ intercept of linear equation} - \text{minimum discharge voltage})/\text{absolute value of linear equation slope}\} * \text{minimum discharge voltage}.$$

20. The method for estimating a power of a secondary battery according to claim 15, further comprising:
outputting the estimated maximum power of the secondary battery.

21. The method for estimating a power of a secondary battery according to claim 15, further comprising:
transmitting the estimated maximum power of the secondary battery to an external control unit.

22. The method for estimating a power of a secondary battery according to claim 15, further comprising:
storing the plurality of discharge rates and discharge end voltages, the slope and Y intercept of the approximated linear equation.

\* \* \* \* \*